(12) United States Patent
Oh et al.

(10) Patent No.: US 12,382,818 B2
(45) Date of Patent: Aug. 5, 2025

(54) DISPLAY PANEL AND DISPLAY DEVICE INCLUDING ENCAPSULATION LAYER

(71) Applicant: Samsung Display Co., LTD., Yongin-si (KR)

(72) Inventors: Minjeong Oh, Gimpo-si (KR); Kwang Soo Bae, Yongin-si (KR); Youngje Cho, Hwaseong-si (KR); Chaungi Choi, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 260 days.

(21) Appl. No.: 17/196,401

(22) Filed: Mar. 9, 2021

(65) Prior Publication Data
US 2022/0005874 A1 Jan. 6, 2022

(30) Foreign Application Priority Data
Jul. 1, 2020 (KR) .................. 10-2020-0080992

(51) Int. Cl.
*H10K 59/80* (2023.01)
*G02B 1/11* (2015.01)
(Continued)

(52) U.S. Cl.
CPC ......... *H10K 59/873* (2023.02); *H10K 50/844* (2023.02); *H10K 50/86* (2023.02); *H10K 50/865* (2023.02); *H10K 59/122* (2023.02); *H10K 59/38* (2023.02); *H10K 59/40* (2023.02); *H10K 59/875* (2023.02); *H10K 59/879* (2023.02); *H10K 59/8792* (2023.02); *G02B 1/11* (2013.01); *G02B 5/201* (2013.01)

(58) Field of Classification Search
CPC ...... H10K 59/38; H10K 50/844; H10K 50/86; H10K 50/865; H10K 59/122; H10K 59/40; H10K 50/858; H10K 59/35; H10K 50/8426; H10K 50/85; H10K 59/126; G02B 1/11; G02B 5/201
See application file for complete search history.

(56) References Cited

U.S. PATENT DOCUMENTS 7,446,462 B2 11/2008 Lim et al.
10,566,578 B2 2/2020 Sakamoto et al.
(Continued)

FOREIGN PATENT DOCUMENTS

CN 109545821 3/2019
CN 110873912 3/2020
(Continued)

*Primary Examiner* — Eva Y Montalvo
*Assistant Examiner* — Zhijun Xu
(74) *Attorney, Agent, or Firm* — KILE PARK REED & HOUTTEMAN PLLC

(57) ABSTRACT

A display device includes a display panel including light emitting elements and an anti-reflective layer. The anti-reflective layer is disposed on the display panel and includes a first layer comprising a pattern having a first refractive index, a second layer having a second refractive index greater than the first refractive index of the first layer, and a color filter layer overlapping the first layer and the second layer. The pattern of the first layer comprises a surface inclined with respect to an upper surface of the display panel, and the second layer is disposed on the surface of the pattern of the first layer.

20 Claims, 14 Drawing Sheets

(51) Int. Cl.
  *G02B 5/20*      (2006.01)
  *H10K 50/844*   (2023.01)
  *H10K 50/86*    (2023.01)
  *H10K 59/122*   (2023.01)
  *H10K 59/38*    (2023.01)
  *H10K 59/40*    (2023.01)

(56) References Cited

U.S. PATENT DOCUMENTS

| | | |
|---|---|---|
| 10,782,529 B2 | 9/2020 | Choi et al. |
| 11,005,076 B2 | 5/2021 | Lee |
| 11,450,714 B2 | 9/2022 | Joo et al. |
| 2006/0082285 A1 | 4/2006 | Wu et al. |
| 2013/0214301 A1* | 8/2013 | Yamada .................. H01L 33/60 438/31 |
| 2016/0266436 A1* | 9/2016 | Jiao ........................ H10K 59/38 |
| 2016/0351641 A1* | 12/2016 | Ito .......................... H10K 71/00 |
| 2017/0176816 A1* | 6/2017 | Han .................. G02F 1/133617 |
| 2018/0166507 A1* | 6/2018 | Hwang ............... G06F 3/04166 |
| 2020/0073169 A1* | 3/2020 | Jung ................. G02F 1/133514 |
| 2020/0117048 A1* | 4/2020 | Jeong ................... G02B 6/0051 |
| 2020/0194729 A1* | 6/2020 | Park ....................... H10K 50/86 |
| 2022/0005874 A1 | 1/2022 | Oh et al. |

FOREIGN PATENT DOCUMENTS

| | | |
|---|---|---|
| CN | 111146354 | 5/2020 |
| CN | 111341805 | 6/2020 |
| CN | 215834532 | 2/2022 |
| JP | 2017-174553 | 9/2017 |
| KR | 10-0624307 | 9/2006 |
| KR | 10-2018-0063700 | 6/2018 |
| TW | I240593 | 9/2005 |

* cited by examiner

DISPLAY PANEL AND DISPLAY DEVICE INCLUDING ENCAPSULATION LAYER

CROSS-REFERENCE TO RELATED APPLICATION(S)

This application claims priority to and benefits of Korean Patent Application No. 10-2020-0080992 under 35 U.S.C. § 119, filed on Jul. 1, 2020 in the Korean Intellectual Property Office, the entire contents of which are incorporated herein by reference.

BACKGROUND

1. Technical Field

The disclosure relates to a display panel and a display device. The disclosure relates to a display panel including a light emitting element having reduced reflectance and a display device.

2. Description of the Related Art

Various electronic items, such as smartphones, tablet computers, notebook computers, and smart televisions, are being developed. The electronic items may include a display device to provide information. The display device is increasing in importance with the development of multimedia. Various display devices, such as a liquid crystal display, an organic light emitting display, for example, are being used. For example, the display device may include a color conversion layer including quantum dots that may convert a light of a specific or predetermined color into a light of another color.

The organic light emitting display may include an organic light emitting diode emitting a light. However, a phenomenon may occur in which an external light incident into the display device may be reflected while traveling to the organic light emitting diode. This phenomenon may lead to a decrease in luminance and color gamut of the organic light emitting display.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display panel capable of reducing an amount of an external light traveling to an organic light emitting diode to prevent deterioration in contrast and visibility thereof.

The disclosure provides a display device including the display panel.

Embodiments provide a display device including a display panel including light emitting elements; and an anti-reflective layer disposed on the display panel. The anti-reflective layer may include a first layer comprising a pattern having a first refractive index; a second layer having a second refractive index greater than the first refractive index of the first layer; and a color filter layer overlapping the first layer and the second layer. The pattern of the first layer may comprise a surface inclined with respect to an upper surface of the display panel, and the second layer may be disposed on the surface of the pattern of the first layer.

The display panel may further include a pixel definition layer disposed between the light emitting elements.

The pixel definition layer may include a light blocking material.

The color filter layer may include a plurality of color filters; and a light blocking layer disposed between the plurality of color filters.

The pixel definition layer may include a first opening area that may expose the light emitting elements, and the light blocking layer may include a second opening area, the second opening area may be larger than the first opening area.

The first layer and the second layer of the anti-reflective layer may be disposed in the second opening area.

The display device may further include an input sensing layer disposed between the display panel and the anti-reflective layer.

The display panel may further include an encapsulation layer overlapping the light emitting elements, and the input sensing layer may be disposed directly on the encapsulation layer.

The pattern of the first layer of the anti-reflective layer may include a first surface facing the upper surface of the display panel; and a second surface opposite to the first surface, and the second surface may have a smaller width than a width of the first surface.

The second layer of the anti-reflective layer may include a third opening area that may expose the second surface of the pattern of the first layer of the anti-reflective layer.

The pattern may be provided in plural, and the plurality of patterns may be spaced apart from each other in a first direction and a second direction. The first and second directions may be different from each other.

The pattern may be provided in plural, and the plurality of patterns may be extended in a first direction and spaced apart from each other in a second direction. The first and second directions may be different from each other.

The pattern may have a closed-loop shape.

Embodiments provide a display panel that may a light emitting element layer emitting a first color light; a color conversion layer; and a light guide layer. The color conversion layer may include a plurality of color conversion members disposed on the light emitting element layer, receiving the first color light from the light emitting element layer, and converting the first color light to emit at least two different color lights. The light guide layer may be disposed on the color conversion layer and may change a path of a light incident into the display panel from an outside of the display panel. The light guide layer may include a first layer including a surface inclined with respect to an upper surface of the color conversion layer, and a pattern having a first refractive index; and a second layer disposed on the surface of the first layer and having a second refractive index greater than the first refractive index.

The light emitting element layer may include light emitting elements emitting the first color light; and a pixel definition layer disposed between the light emitting elements.

The display panel may further include a color filter layer disposed between the color conversion layer and the light guide layer.

The color filter layer may include a plurality of color filters; and a light blocking layer disposed between the plurality of color filters.

The color conversion layer may further include a barrier layer disposed between the plurality of color conversion members.

The barrier layer may include a light blocking material.

The light guide layer may overlap the plurality of color conversion members and the barrier layer.

According to the above, the path of the light incident into the display device and the display panel from the outside may be controlled, and thus, an amount of the light traveling to the light emitting elements may be reduced. Thus, deterioration in contrast and visibility of the display device and the display panel may be prevented.

BRIEF DESCRIPTION OF THE DRAWINGS

The above and other advantages of the disclosure will become readily apparent by reference to the following detailed description when considered in conjunction with the accompanying drawings wherein.

DETAILED DESCRIPTION OF THE EMBODIMENTS

Figure 1:
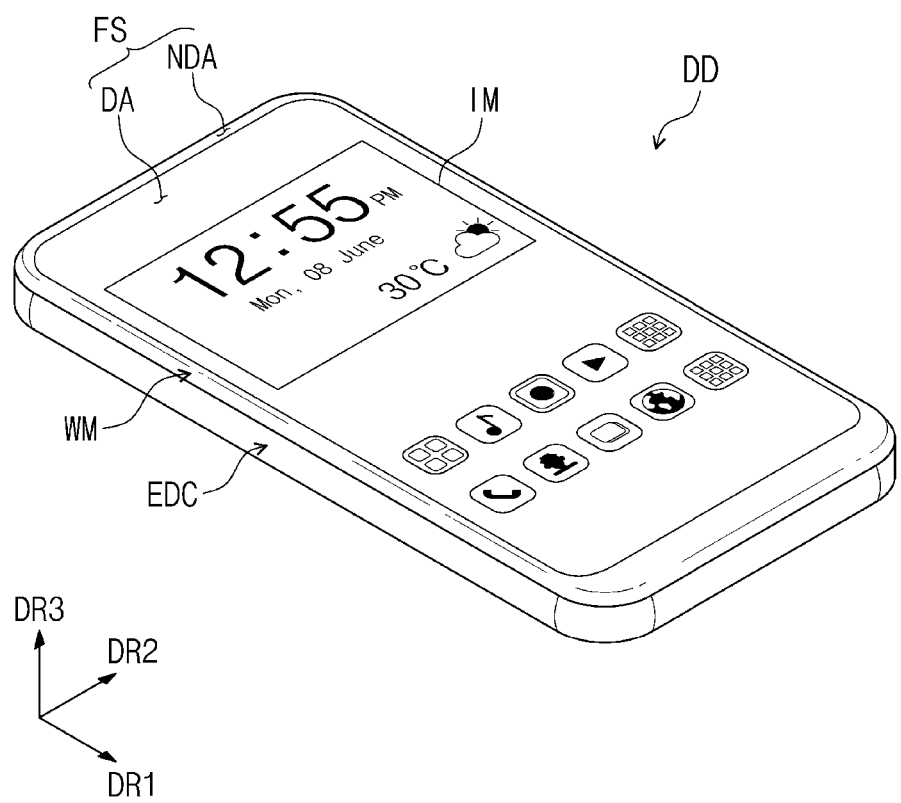
FIG. 1 is an assembled perspective view showing a display device according to an embodiment.

In the disclosure, it will be understood that when an element or layer is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components may be exaggerated for effective description of the disclosure and for clarity.

As used herein, the term "and/or" includes any and all combinations of one or more of the associated listed items.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B".

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures, but is not limited thereto.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", "comprises" and/or "comprising", "have" and/or "having" and their variations when used in this specification, specify the presence of stated features, integers, steps, operations, elements, and/or components, but do not preclude the presence or addition of one or more other features, integers, steps, operations, elements, components, and/or groups thereof.

Hereinafter, the disclosure will be explained in detail with reference to the accompanying drawings.

Figure 2:
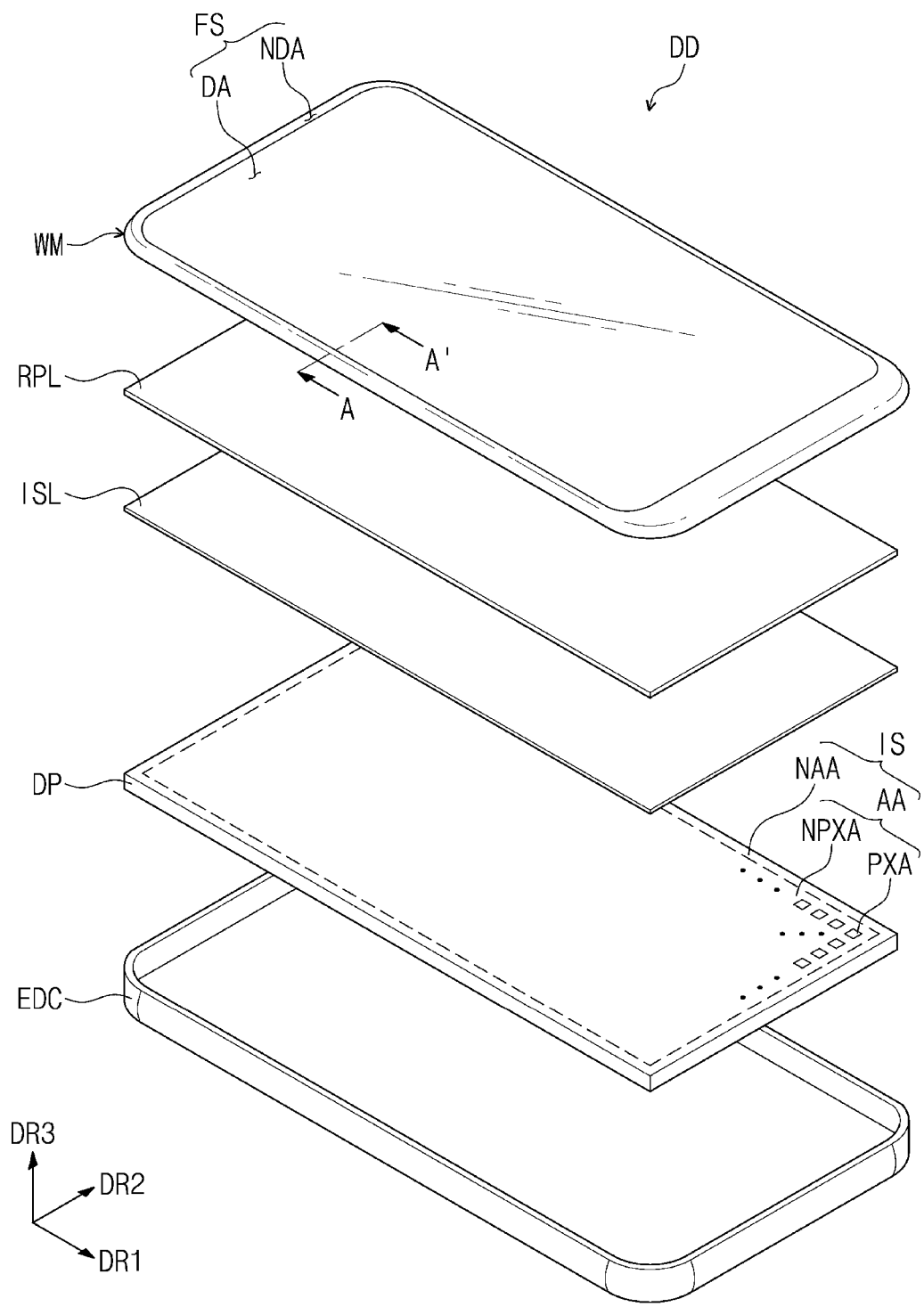
FIG. 2 is an exploded perspective view showing a display device according to an embodiment.

FIG. 1 is an assembled perspective view showing a display device DD according to an embodiment, and FIG. 2 is an exploded perspective view showing the display device DD according to an embodiment.

Referring to FIGS. 1 and 2, the display device DD has a substantially rectangular shape with long sides in a first reference direction DR1 and short sides in a second reference direction DR2. However, the shape of the display device DD should not be limited thereto or thereby, and the display device DD may have a variety of shapes.

The display device DD may be a large-sized display device, such as a television set, a monitor, or the like, or a small- and medium-sized display device, such as a mobile phone, a tablet computer, a vehicle navigation unit, a game unit, or the like within the spirit and the scope of the disclosure. However, this is merely an example, and the display device DD may be employed in other electronic items within the spirit and the scope of the disclosure.

Referring to FIG. 1, the display device DD may display an image IM toward a third reference direction DR3 through a display surface FS substantially parallel to each of the first reference direction DR1 and the second reference direction DR2. The display surface FS through which the image IM may be displayed may correspond to a front surface of the display device DD.

The display surface FS of the display device DD may be divided into a plurality of areas. The display surface FS of the display device DD may include a display area DA and a non-display area NDA, which may be formed or included therein.

The display area DA may be an area through which the image IM may be displayed, and a user views the image IM through the display area DA. The display area DA may have a substantially quadrangular shape. The non-display area NDA may surround or may be adjacent to the display area DA. Accordingly, the display area DA may have a shape formed by the non-display area NDA, however, this is merely an example. The non-display area NDA may be adjacent to only one or a side of the display area DA or may be omitted. The display device DD according to an embodiment may include various embodiments and should not be particularly limited.

The non-display area NDA may be adjacent to the display area DA, and the image IM may not be displayed through the non-display area NDA. A bezel area of the display device DD may be formed by the non-display area NDA.

The non-display area NDA may surround or may be adjacent to the display area DA, however, this is merely an example. The non-display area NDA may be disposed adjacent to only a portion of an edge of the display area DA and should not be particularly limited.

The display device DD may sense a user input provided from the outside. The user input may include various forms of external inputs, such as a portion of the user's body, light, heat, or pressure. The display device DD may sense the user input applied to a side or rear surface of the display device DD depending on a structure of the display device DD, and, it should not be limited to a particular embodiment.

The display device DD may activate the display surface FS to display the image IM and may substantially simultaneously sense the external input. In an embodiment, an area in which the external input may be sensed may be included in the display area DA. However, this is merely an example, and the area in which the external input is sensed may be included in the non-display area NDA or may be included over an entire area of the display surface FS.

Referring to FIG. 2, the display device DD may include a display panel DP, an anti-reflective layer RPL disposed on the display panel DP, a window WM disposed on the anti-reflective layer RPL, an input sensing layer ISL disposed between the display panel DP and the anti-reflective layer RPL, and a cover case EDC.

An upper surface of the window WM may define the display surface FS of the display device DD. The window WM may be optically transparent. Accordingly, an image generated by the display panel DP may be easily viewed by the user through the window WM.

The or an upper surface of the window WM may include the display area DA and the non-display area NDA. The display area DA may transmit the light provided from the display panel DP. The non-display area NDA may have a relatively low light transmittance compared to the display area DA. The non-display area NDA may define or form the shape of the display area DA. The window WM may have a predetermined color in the non-display area NDA.

The window WM may include a flexible material. For example, a shape of the window WM may be changed to correspond to a change in shape of the display panel DP. The window WM may transmit the image from the display panel DP and, substantially simultaneously, may reduce external impacts, and thus, the window WM may prevent the display panel DP from being damaged or malfunctioned due to the external impacts. The external impacts from the outside may refer to forces that may cause defects in the display panel DP, which may be expressed as pressure or stress.

The display panel DP may output the image through a front surface IS. The front surface IS may include an active area AA and a peripheral area NAA. The image IM (refer to FIG. 1) may be displayed through the active area AA. The peripheral area NAA may be defined adjacent to the active area AA.

The active area AA of the display panel DP may correspond to the display area DA of the window WM. Accordingly, the image IM displayed through the active area AA may be viewed from the outside through the display area DA.

The non-display area NDA of the window WM may cover or overlap the peripheral area NAA of the display panel DP to prevent the peripheral area NAA from being viewed from the outside. For example, in a case that the light generated by the display panel DP is leaked to the peripheral area NAA, the leaking light may be blocked by the non-display area NDA, and thus, the peripheral area NAA may be prevented from being viewed from the outside.

The display panel DP may include a plurality of pixels. The pixels may output lights having color information in response to electrical signals and may display the image IM through the active area AA. The active area AA may include a plurality of pixel areas PXA corresponding to the pixels and a non-pixel area NPXA adjacent to the pixel areas PXA.

The display panel DP may be a flexible display panel. As an example, the display panel DP may be an organic light emitting display panel.

The cover case EDC may provide a rear surface of the display device DD. The cover case EDC may be coupled or connected to the window WM to provide an inner space. The display panel DP and circuit components, a camera module, and power modules, which may be coupled or connected to the display panel DP, may be accommodated in the inner space. The cover case EDC may include a material with a predetermined rigidity. For example, the cover case EDC may include a plurality of frames and/or plates containing glass, plastic, metal, or a combination thereof. The cover case EDC may stably protect components of the display device DD, which may be accommodated in the inner space, from external impacts.

The anti-reflective layer RPL may be disposed on the display panel DP. The anti-reflective layer RPL may reduce a reflectance of the external light incident to the window WM from the above of the window WM. The anti-reflective layer RPL according to an embodiment may include a color filter layer CFL (refer to FIG. 3), however, it should not be limited thereto or thereby. The anti-reflective layer RPL may include a retarder and a polarizer. The retarder may be a film type or liquid crystal coating type and may include a λ/2 retarder and/or a λ/4 retarder. The polarizer may be a film type or liquid crystal coating type.

The input sensing layer ISL may be disposed between the display panel DP and the anti-reflective layer RPL. The input sensing layer ISL may be disposed directly on the display panel DP. For example, in a case that the input sensing layer ISL is disposed directly on the display panel DP, an adhesive film may not be disposed between the input sensing layer ISL and the display panel DP. The display panel DP may generate the image, and the input sensing layer ISL may obtain coordinate information about the external input, for example, a touch event.

Figure 3:
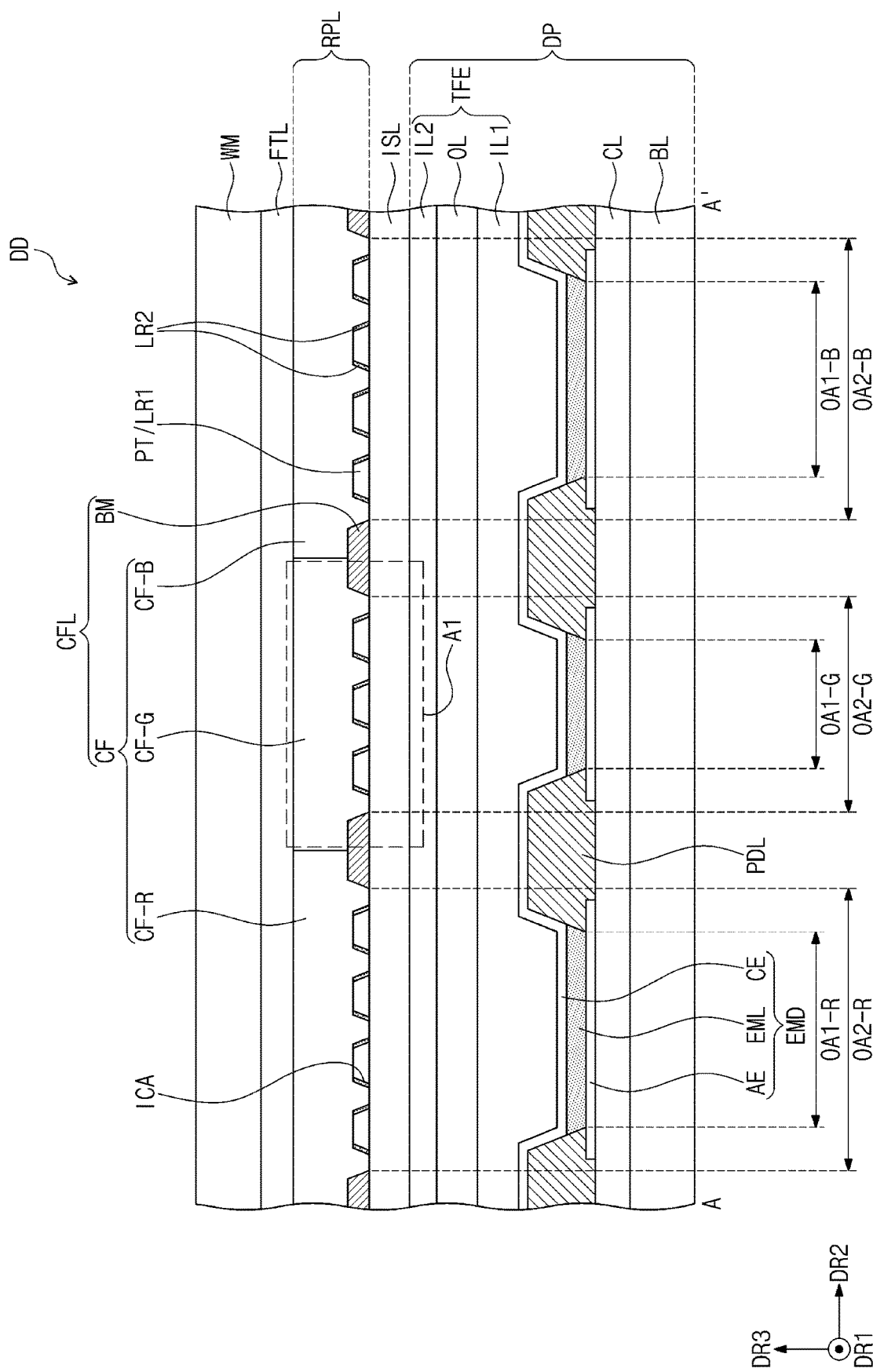
FIG. 3 is a schematic cross-sectional view taken along a line A-A' shown in FIG. 2.

FIG. 3 is a schematic cross-sectional view taken along a line A-A' shown in FIG. 2.

Referring to FIG. 3, the display panel DP may include a base layer BL, a circuit layer CL disposed on the base layer BL, light emitting elements EMD, and a pixel definition layer PDL disposed between the light emitting elements EMD, an encapsulation layer TFE, and the input sensing layer ISL.

The base layer BL may include a synthetic resin layer. The synthetic resin layer may be formed on a work substrate used in a case that the display panel DP is manufactured. Then, a conductive layer and an insulating layer may be formed or disposed on the synthetic resin layer. In a case that the work substrate is removed, the synthetic resin layer may correspond to the base layer BL. The synthetic resin layer may be a polyimide-based resin layer, however, a material for the synthetic resin layer should not be particularly limited. For example, the base layer BL may include a glass substrate, a metal substrate, or an organic/inorganic composite substrate.

The circuit layer CL may include at least one insulating layer and a circuit element. Hereinafter, the insulating layer included in the circuit layer CL may be referred to as an "interlayer insulating layer". The interlayer insulating layer may include at least one intermediate inorganic layer and at least one intermediate organic layer. The circuit element may include a signal line and a pixel driving circuit. The circuit layer CL may be formed through a forming process of the interlayer insulating layer, a semiconductor layer, and a conductive layer using coating and depositing processes and a patterning process of the interlayer insulating layer, the semiconductor layer, and the conductive layer using a photolithography process.

The light emitting elements EMD may include an organic light emitting diode. The pixel definition layer PDL may include an organic material. First electrodes AE may be disposed on the circuit layer CL. The pixel definition layer PDL may be disposed on the first electrodes AE. The first electrodes AE may include a metal alloy or a conductive compound. The first electrodes AE may be an anode.

Each first electrode AE of the light emitting elements EMD may be a reflective electrode, however, it should not be limited thereto or thereby. For example, each first electrode AE may be a transmissive electrode or a transflective electrode. In a case that each first electrode AE is the transflective electrode or the reflective electrode, each first electrode AE may include Ag, Mg, Cu, Al, Pt, Pd, Au, Ni, Nd, Ir, Cr, Li, Ca, LiF/Ca, LiF/Al, Mo, Ti, a compound thereof, or a mixture thereof, for example, a mixture of Ag and Mg.

First opening areas OA1-R, OA1-G, and OA1-B may be defined or formed through the pixel definition layer PDL. At least portions of the first electrodes AE may be exposed through the first opening areas OA1-R, OA1-G, and OA1-B of the pixel definition layer PDL. In an embodiment, the pixel definition layer PDL may be omitted.

As shown in FIG. 2, the display panel DP may include the pixel areas PXA and the non-pixel areas NPXA adjacent to the pixel areas PXA. Each non-pixel area NPXA may surround a corresponding pixel area among the pixel areas PXA. In an embodiment, the pixel areas PXA may correspond to the portions of the first electrodes AE exposed through the first opening areas OA1-R, OA1-G, and OA1-B. The non-pixel area NPXA may correspond to areas in which the pixel definition layer PDL may be disposed. The first electrodes AE may be formed or disposed in the pixels PX, respectively.

The pixel definition layer PDL may be formed of a polymer resin. For example, the pixel definition layer PDL may include a polyacrylate-based resin or a polyimide-based resin. For example, the pixel definition layer PDL may further include an inorganic material in addition to the polymer resin. Meanwhile, the pixel definition layer PDL may include a light blocking material or may include a black pigment or a black dye. The pixel definition layer PDL including the black pigment or the black dye may form a black pixel definition layer. In a case that the pixel definition layer PDL is formed, a carbon black may be used as the black pigment or the black dye, however, the disclosure should not be limited thereto or thereby.

A light emitting layer EML that emits the light may be disposed on the first electrodes AE. The light emitting layer EML may be disposed in areas corresponding to the first opening areas OA1-R, OA1-G, and OA1-B. For example, the light emitting layer EML may be formed separately in each of the first opening areas OA1-R, OA1-G, and OA1-B. The light emitting layer EML may include an organic material and/or an inorganic material. The light emitting layer EML may generate a predetermined color light. For example, the light emitting layer EML may generate at least one light among a red light, a green light, and a blue light. A first opening area corresponding to a light emitting layer generating the red light, a first opening area corresponding to a light emitting layer generating the green light, and a first opening area corresponding to a light emitting layer generating the blue light may be referred to as a first red opening area OA1-R, a first green opening area OA1-G, and a first blue opening area OA1-B, respectively.

In an embodiment, the light emitting layer EML may be patterned and may be commonly disposed in the first opening areas OA1-R, OA1-G, and OA1-B. In this case, the light emitting layer EML may generate a white light. For example, the light emitting layer EML may have a multi-layer structure that is called a "tandem".

Although not shown separately, a hole control layer may be disposed between the light emitting layer EML and the first electrodes AE.

A second electrode CE may be disposed on the light emitting layer EML. The second electrode CE may be commonly disposed over the pixel areas PXA and the non-pixel area NPXA. The second electrode CE may be a common electrode or a cathode. The second electrode CE may include a metal alloy or a conductive compound. The second electrode CE may be a transmissive electrode, a transflective electrode, or a reflective electrode. In a case that the second electrode CE is the transmissive electrode, the second electrode CE may include a transparent metal oxide, for example, indium tin oxide (ITO), indium zinc oxide (IZO), zinc oxide (ZnO), or indium tin zinc oxide (ITZO).

Although not shown separately, an electron transport layer may be disposed between the second electrode CE and the light emitting layer EML.

The encapsulation layer TFE may be disposed on the second electrode CE. The encapsulation layer TFE may encapsulate the light emitting elements EMD. The encapsulation layer TFE may include at least one insulating layer. The encapsulation layer TFE may include at least one inorganic layer (hereinafter, referred to as a "first encapsulation inorganic layer IL1"). The encapsulation layer TFE may further include at least one organic layer (hereinafter, referred to as an "encapsulation organic layer OL") and at least one inorganic layer (hereinafter, referred to as a "second encapsulation inorganic layer IL2"). The encapsulation organic layer OL may be disposed between the first and second encapsulation inorganic layers IL1 and IL2.

The first and second encapsulation inorganic layers IL1 and IL2 may protect the light emitting elements EMD from moisture and oxygen, and the encapsulation organic layer OL may protect the light emitting elements EMD from a foreign substance such as dust particles. The first and second encapsulation inorganic layers IL1 and IL2 may include a silicon nitride layer, a silicon oxynitride layer, a silicon oxide layer, a titanium oxide layer, or an aluminum oxide layer, however, it should not be particularly limited. The encapsulation organic layer OL may include an acrylic-based organic layer, however, it should not be particularly limited.

Figure 5A:
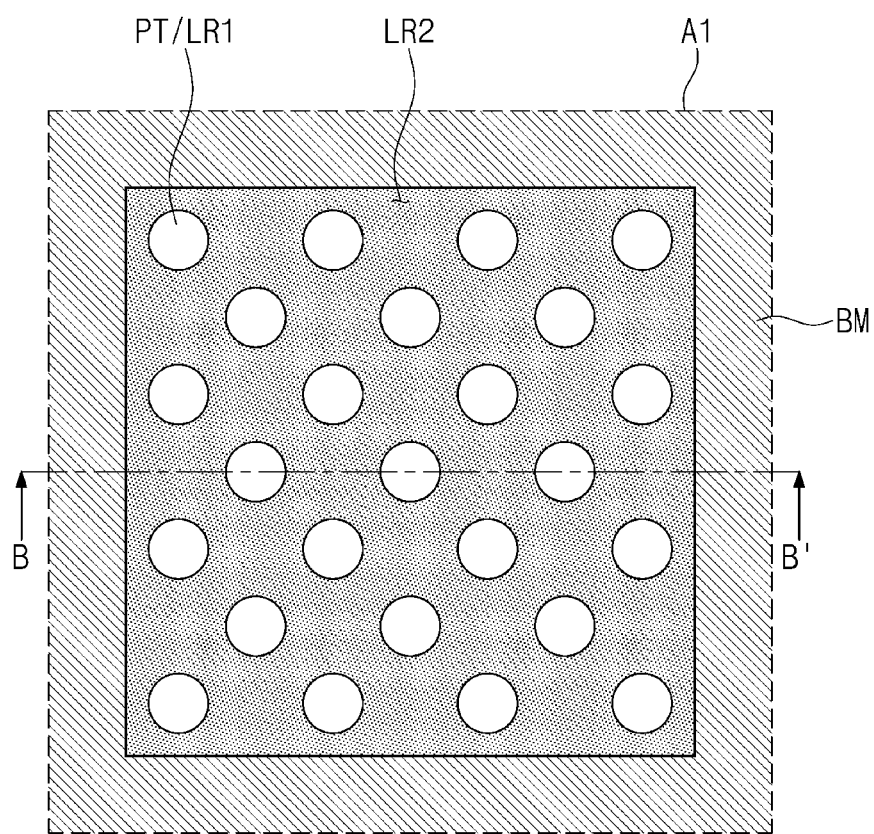
FIG. 5A is an enlarged plan view showing a display panel in an area A1 shown in FIG. 3.
Figure 5A:
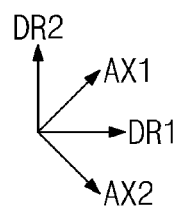
Figure 5B:
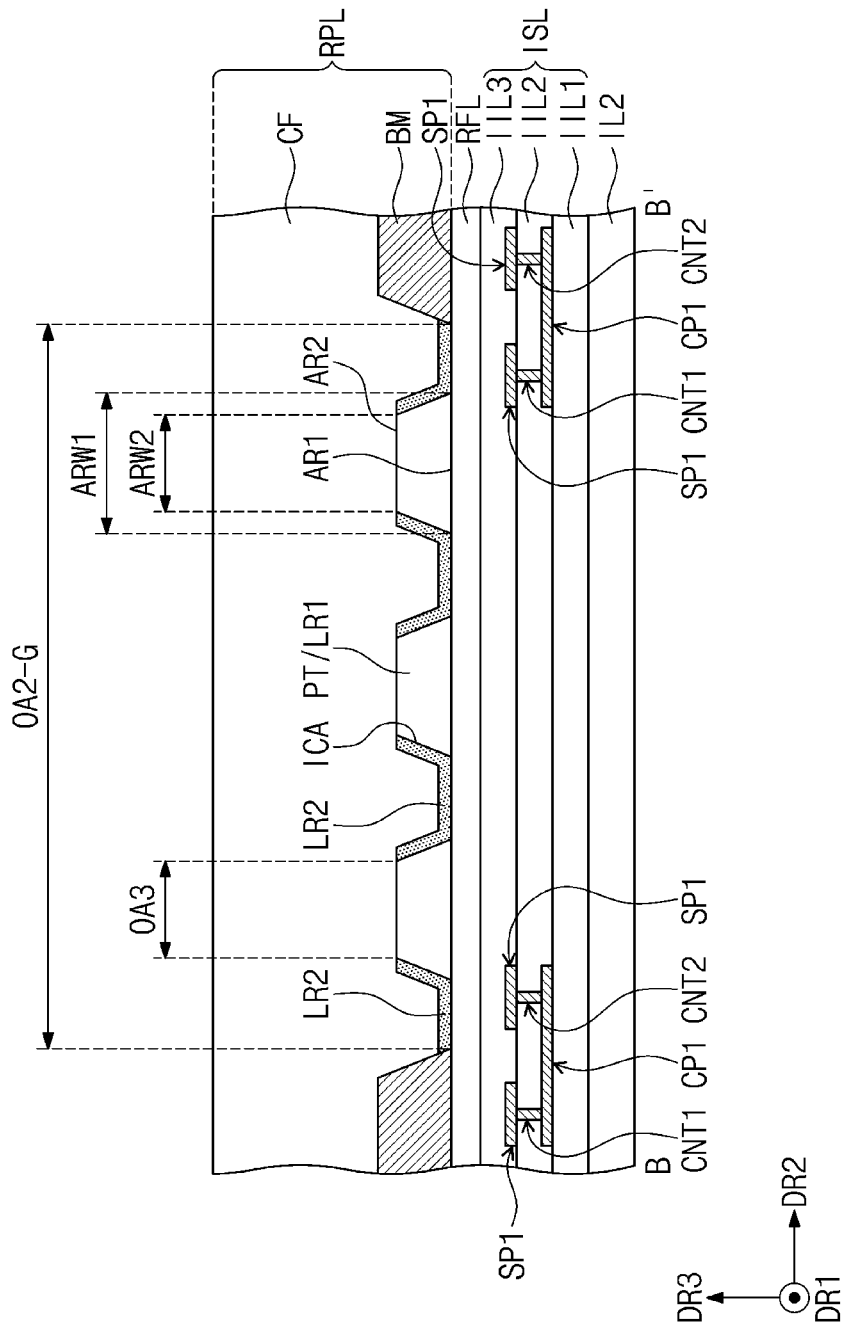
FIG. 5B is an enlarged schematic cross-sectional view taken along a line B-B' shown in FIG. 5A.

Referring to FIGS. 3 and 5B, the input sensing layer ISL may include a first insulating layer IIL1, a first conductive layer disposed on the first insulating layer IIL1, a second insulating layer IIL2 covering or overlapping the first conductive layer, and a second conductive layer disposed on the second insulating layer IIL2. The first insulating layer IIL1 may include an inorganic material. For instance, the first insulating layer IIL1 may include a silicon nitride layer. The second encapsulation inorganic layer IL2 disposed at an uppermost position of the encapsulation layer TFE may include a silicon nitride layer. However, the silicon nitride layer of the encapsulation layer TFE and the silicon nitride layer of the first insulating layer IIL1 may be formed under or by different deposition conditions from each other.

The first conductive layer may be disposed on the first insulating layer IIL1. The first conductive layer may include a first connection portion CP1. The second conductive layer may be disposed on the first conductive layer. The second conductive layer may include a first sensing portion SP1.

The second insulating layer IIL2 may be disposed between the first conductive layer and the second conductive layer. The second insulating layer IIL2 may separate the first conductive layer from the second conductive layer in cross-section. The second insulating layer IIL2 may be provided with first and second contact holes CNT1 and CNT2 provided therethrough to partially expose the first connection portion CP1. The first connection portion CP1 may be in electrical contact with two first sensing portions SP1 adjacent to each other through the first and second contact holes CNT1 and CNT2.

The second insulating layer IIL2 may include an inorganic material. For example, the second insulating layer IIL2 may include a silicon nitride layer. As an example, the second insulating layer IIL2 may have a thickness greater than that of the first insulating layer IIL1.

The input sensing layer ISL may further include a third insulating layer IIL3. The third insulating layer IIL3 may cover or overlap the second insulating layer IIL2 and the first sensing portion SP1 included in the second conductive layer. The third insulating layer IIL3 may include an organic material. The third insulating layer IIL3 may include an acrylic-base resin. The third insulating layer IIL3 may have a thickness greater than that of the first and second insulating layers IIL1 and IIL2. For example, the input sensing layer ISL may further include a high refractive-index layer RFL. The high refractive-index layer RFL may be disposed on the third insulating layer IIL3. The lights generated by the light emitting elements EMD may be diffracted due to a difference in refractive index between the high refractive-index layer RFL and the third insulating layer IIL3. Accordingly, as a front light traveling upward along a third reference direction DR3 substantially perpendicular to the display device DD and a lateral light inclined compared to the front light are diffracted, a difference in color between a front direction and a lateral direction may be reduced, and thus, overall viewing angle characteristics of the display device DD may be improved. However, the high refractive-index layer RFL may be omitted according to an embodiment.

As an example, The second conductive layer may be include a second sensing portion and a second connection portion. The second connection portion may be formed to penetrate through a space between the two first sensing portions. Two second sensing portions adjacent to each other may be electrically connected by the second connection portion.

Referring to FIG. 3, the anti-reflective layer RPL may be disposed on the display panel DP. The anti-reflective layer RPL may include a first layer LR1 comprising a plurality of patterns PT having a first refractive index n1. Each of the patterns PT may comprise an inclination surface ICA inclined with respect to the upper surface of the display panel DP. For example, the anti-reflective layer RPL may include a second layer LR2 disposed at least on the inclination surface ICA and having a second refractive index n2 higher or greater than the first refractive index n1 and a color filter layer CFL disposed to overlap the first layer LR1 and the second layer LR2. Since the patterns PT included in the first layer LR1 include the inclination surface ICA inclined with respect to the upper surface of the display panel DP, the second layer LR2 disposed at least on the inclination surface ICA of the first layer LR1 may include the inclination surface ICA inclined with respect to the upper surface of the display panel DP. However, the disclosure should not be limited thereto or thereby, and the second layer LR2 may be disposed on other positions or regions or areas of the first layer LR1 rather than the inclination surface ICA. In an embodiment, a light guide layer LGL may include a first layer including a surface inclined with respect to an upper surface of a color conversion layer CCL, and a pattern having a first refractive index and a second layer disposed on the surface of the first layer and having a second refractive index greater than the first refractive index.

The first layer LR1 may include a material having the first refractive index n1, and the first refractive index n1 may be about 1.5. The first layer LR1 may include an acrylic-based organic layer, however, it should not be particularly limited. The second layer LR2 may include a material having the second refractive index n2, and the second refractive index n2 may be greater than the first refractive index n1. As an example, the second refractive index n2 may be about 1.8. The second layer LR2 may be an inorganic layer that may include a silicon nitride layer, a silicon oxynitride layer, a silicon oxide layer, a titanium oxide layer, or an aluminum oxide layer, however, it should not be particularly limited. In a case that there is a difference (n2−n1) in refractive index between the first layer LR1 and the second layer LR2, an amount of a light LT (refer to FIG. 10) incident to the display device DD from the outside and traveling to the first electrodes AE of the light emitting elements EMD may be reduced compared with that in a case that there is no difference (n2−n1) in refractive index between the first layer LR1 and the second layer LR2.

The anti-reflective layer RPL may include the color filter layer CFL disposed to overlap the first layer LR1 and the second layer LR2. The color filter layer CFL may include a plurality of color filters CF and a light blocking layer BM disposed between the color filters CF. The color filters CF may include a first color filter CF-R provided to correspond to the first red opening area OA1-R, a second color filter CF-G provided to correspond to the first green opening area OA1-G, and a third color filter CF-B provided to correspond to the first blue opening area OA1-B. The first color filter CF-R may be a red color filter, the second color filter CF-G may be a green color filter, and the third color filter CF-B may be a blue color filter. Each of the first, second, and third color filters CF-R, CF-G, and CF-B may include a polymer photosensitive resin and a pigment or a dye. The first color filter CF-R may include a red pigment or dye, the second color filter CF-G may include a green pigment or dye, and the third color filter CF-B may include a blue pigment or dye.

Meanwhile, an embodiment should not be limited thereto or thereby, and the third color filter CF-B may not include the pigment or dye. The third color filter CF-B may include the polymer photosensitive resin and may not include the pigment or dye. The third color filter CF-B may be transparent. The third color filter CF-B may include a transparent photosensitive resin.

The first, second, and third color filters CF-R, CF-G, and CF-B may be spaced apart from each other in the first reference direction DR1 and the second reference direction DR2.

The light blocking layer BM may be disposed between the first, second, and third color filters CF-R, CF-G, and CF-B spaced apart from each other, however, the embodiment should not be limited thereto or thereby. The light blocking layer BM may overlap an edge of the first, second, and third color filters CF-R, CF-G, and CF-B. The light blocking layer BM may be, but is not limited to, a black matrix. The light blocking layer BM may include an organic light blocking material or an inorganic light blocking material, which may include a black pigment or dye. The light blocking layer BM may prevent a light leakage phenomenon and may serve as a boundary between adjacent first to third color filters CF-R, CF-G, and CF-B.

Second opening areas OA2-R, OA2-G, and OA2-B may be defined through the light blocking layer BM. The second opening areas OA2-R, OA2-G, and OA2-B may include a second red opening area OA2-R corresponding to the first red opening area OA1-R, a second green opening area OA2-G corresponding to the first green opening area OA1-G, and a second blue opening area OA2-B corresponding to the first blue opening area OA1-B. Each of the second opening areas OA2-R, OA2-G, and OA2-B may be wider or larger or may have a greater size than a corresponding first opening area among the first opening areas OA1-R, OA1-G, and OA1-B. Each of the second opening areas OA2-R, OA2-G, and OA2-B may be defined to correspond to the whole of the corresponding first opening area among the first opening areas OA1-R, OA1-G, and OA1-B and a portion or region or area of the pixel definition layer PDL.

The first layer LR1 and the second layer LR2 of the anti-reflective layer RPL may be disposed in the second opening areas OA2-R, OA2-G, and OA2-B. Each of the first opening areas OA1-R, OA1-G, and OA1-B may have a size that varies depending on the color of the light generated by the light emitting layer EML disposed on the exposed first electrodes AE. Accordingly, the size of the second opening areas OA2-R, OA2-G, and OA2-B corresponding to the first opening areas OA1-R, OA1-G, and OA1-B may vary, and arrangements of the first layer LR1 and the second layer LR2 of the anti-reflective layer RPL in the second opening areas OA2-R, OA2-G, and OA2-B may vary. As an example, a size of the first green opening area OA1-G corresponding to the light emitting layer EML generating the green light may be smaller than a size of the first red opening area OA1-R corresponding to the light emitting layer EML generating the red light and a size of the first blue opening area OA1-B corresponding to the light emitting layer EML generating the blue light. Accordingly, the number of the patterns PT included in the first layer LR1 disposed in the second green opening area OA2-G may be smaller than the number of the patterns PT disposed in the second red opening area OA2-R and the second blue opening area OA2-B. However, according to an embodiment, the size of the first green opening area OA1-G may be substantially the same as the size of each of the first red opening area OA1-R and the first blue opening area OA1-B.

A planarization layer FTL may be disposed on the anti-reflective layer RPL. The planarization layer FTL may cover or overlap the color filters CF and may have a single-layer or multi-layer structure. The planarization layer FTL may have the single-layer structure of an organic layer and may have the multi-layer structure of an organic layer and an inorganic layer. The planarization layer FTL may provide a planarization surface thereon.

The window WM may be disposed on the planarization layer FTL. The window WM may be optically transparent.

Figure 4:
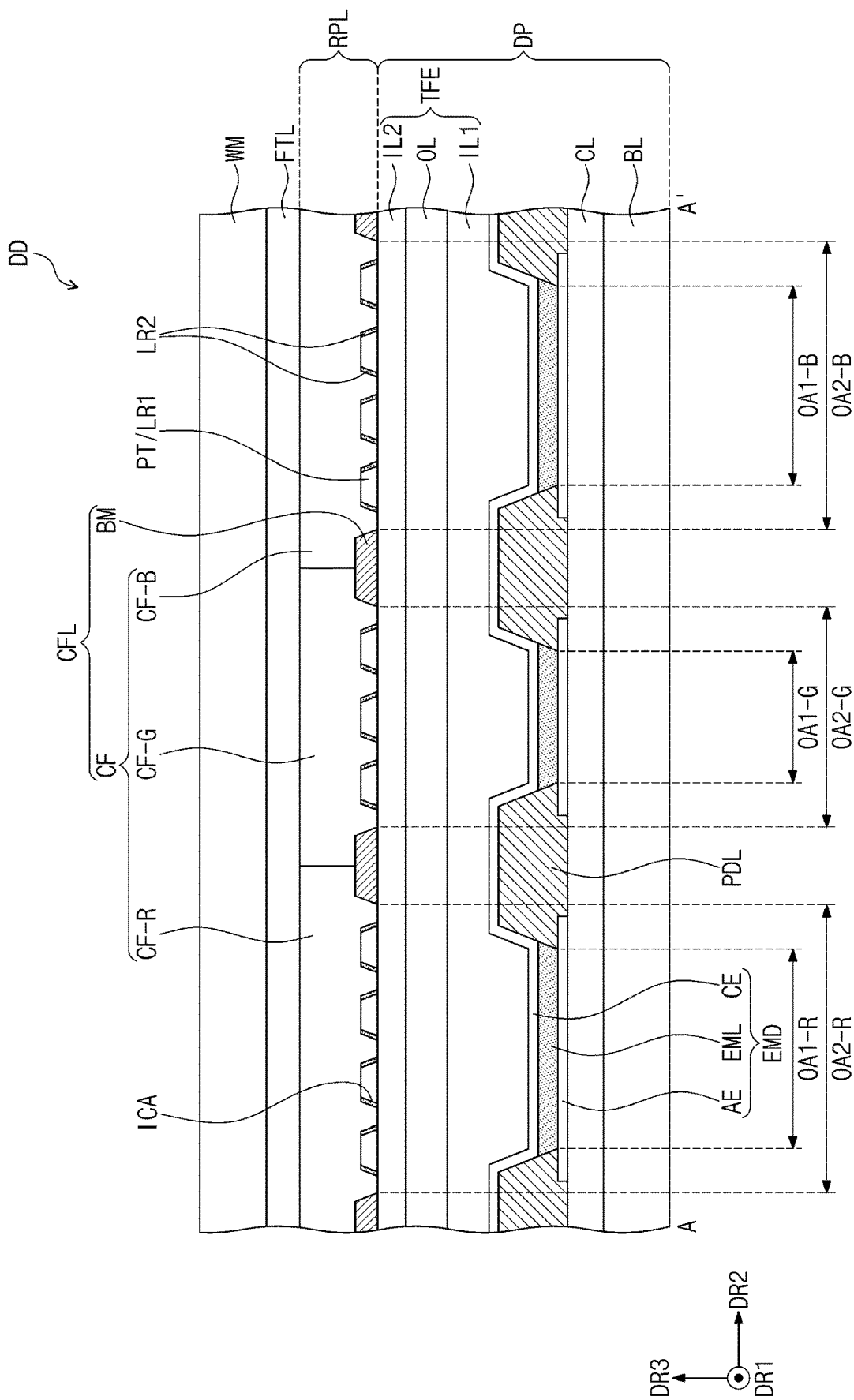
FIG. 4 is a schematic cross-sectional view taken along a line A-A' shown in FIG. 2.

FIG. 4 is a schematic cross-sectional view taken along a line A-A' shown in FIG. 2.

Referring to FIG. 4, the display panel DP may include a base layer BL, a circuit layer CL disposed on the base layer BL, light emitting elements EMD, a pixel definition layer PDL disposed between the light emitting elements EMD, and an encapsulation layer TFE.

An anti-reflective layer RPL may be disposed on the display panel DP. In this case, a first layer LR1 including patterns PT, a second layer LR2, and a color filter layer CFL may be disposed on a second encapsulation inorganic layer IL2 of the encapsulation layer TFE.

FIG. 5A is an enlarged plan view showing a display panel in an area A1 shown in FIG. 3, and FIG. 5B is an enlarged schematic cross-sectional view taken along a line B-B' shown in FIG. 5A.

Referring to FIGS. 5A and 5B, the second layer LR2 of the anti-reflective layer RPL may be disposed not only on the inclination surface ICA of the patterns PT included in the first layer LR1 but also between the patterns PT. In an embodiment, the patterns PT included in the first layer LR1 and the second layer LR2 surrounding the patterns PT may be disposed in the second green opening area OA2-G. The patterns PT may be arranged or disposed in a first direction AX1 between the first reference direction DR1 and the second reference direction DR2 to be spaced apart from each other and may be arranged or disposed in a second direction AX2 different from the first direction AX1 to be spaced apart from each other. However, the disclosure should not be limited thereto or thereby. The first reference direction DR1 may be substantially the same as the first direction AX1, and the second reference direction DR2 may be substantially the same as the second direction AX2. In a case that the patterns PT are arranged or disposed in the first and second directions AX1 and AX2 to be spaced apart from each other, the number of the inclination surfaces ICA formed in the anti-reflective layer RPL may increase. Accordingly, the amount of the light LT (refer to FIG. 10) incident to the display device DD (refer to FIG. 1) from the outside and traveling to the first electrodes AE of the light emitting elements EMD may be reduced.

Referring to FIG. 5B, each of the patterns PT may include a first surface AR1 facing the upper surface of the display panel DP and a second surface AR2 opposite to the first surface AR1. The second surface AR2 of the patterns PT may have a width ARW2 smaller than a width ARW1 of the first surface AR1 of the patterns PT.

The second layer LR2 disposed on the first layer LR1 including the patterns PT may be provided with a third opening area OA3 formed therethrough to expose the second surface AR2 of the patterns PT. In a case that the second layer LR2 is provided with the third opening OA3, a reduction in light extraction efficiency, which may be caused by the light that may be emitted from the light emitting elements EMD and refracted by the second layer LR2 to travel not in the third reference direction DR3 (refer to FIG. 1) perpendicular to the display device DD (refer to FIG. 1) but in an inclined direction, may be prevented.

Figure 6A:
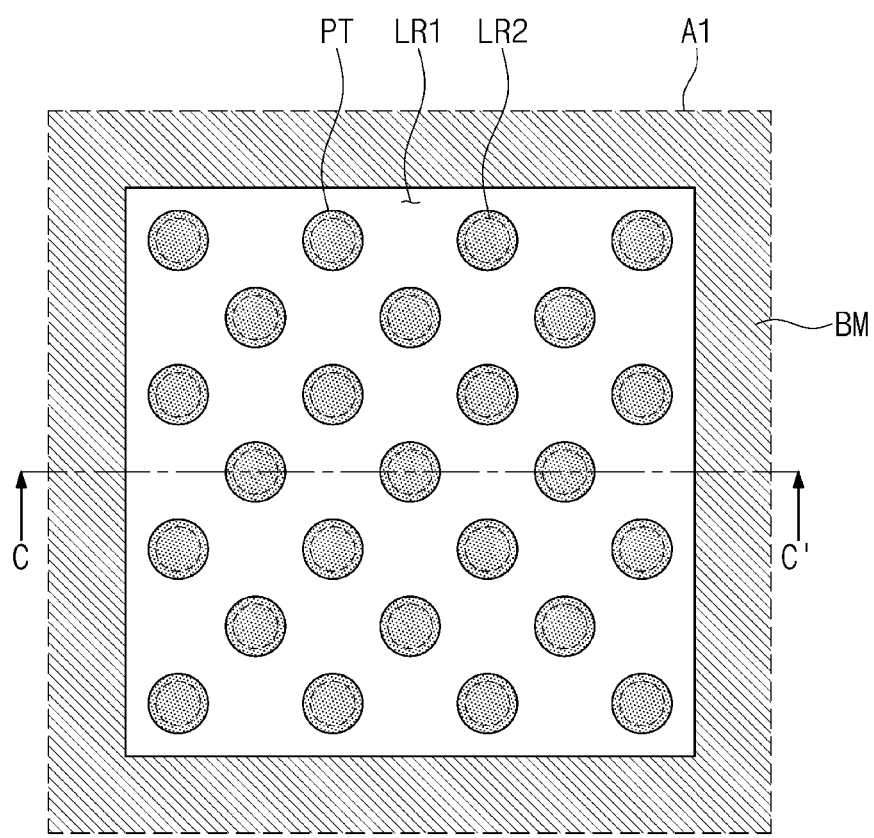
FIG. 6A is an enlarged plan view showing a display panel in an area A1 shown in FIG. 3.
Figure 6B:
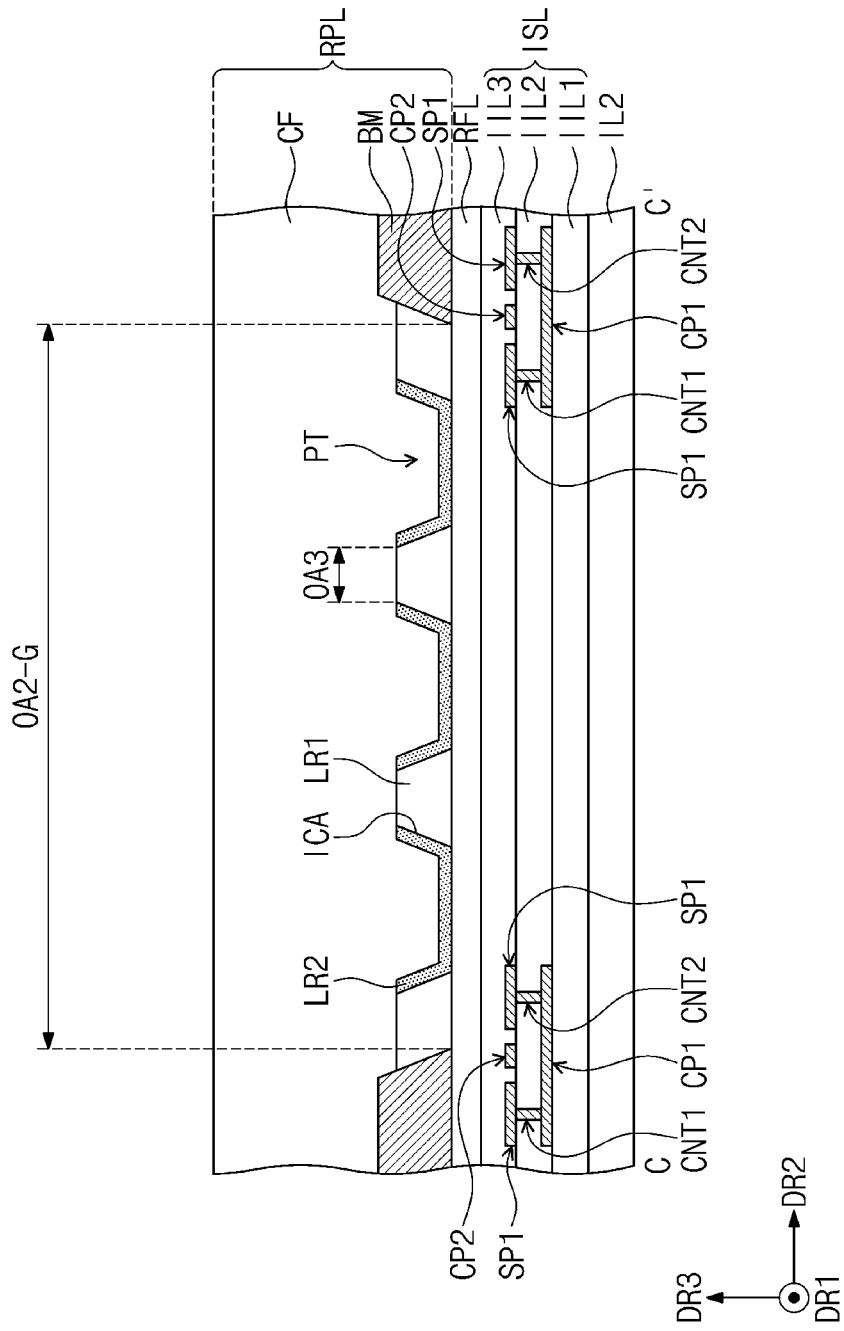
FIG. 6B is an enlarged schematic cross-sectional view taken along a line C-C' shown in FIG. 6A.

FIG. 6A is an enlarged plan view showing a display panel in an area A1 shown in FIG. 3, and FIG. 6B is an enlarged schematic cross-sectional view taken along a line C-C' shown in FIG. 6A.

Figure 7A:
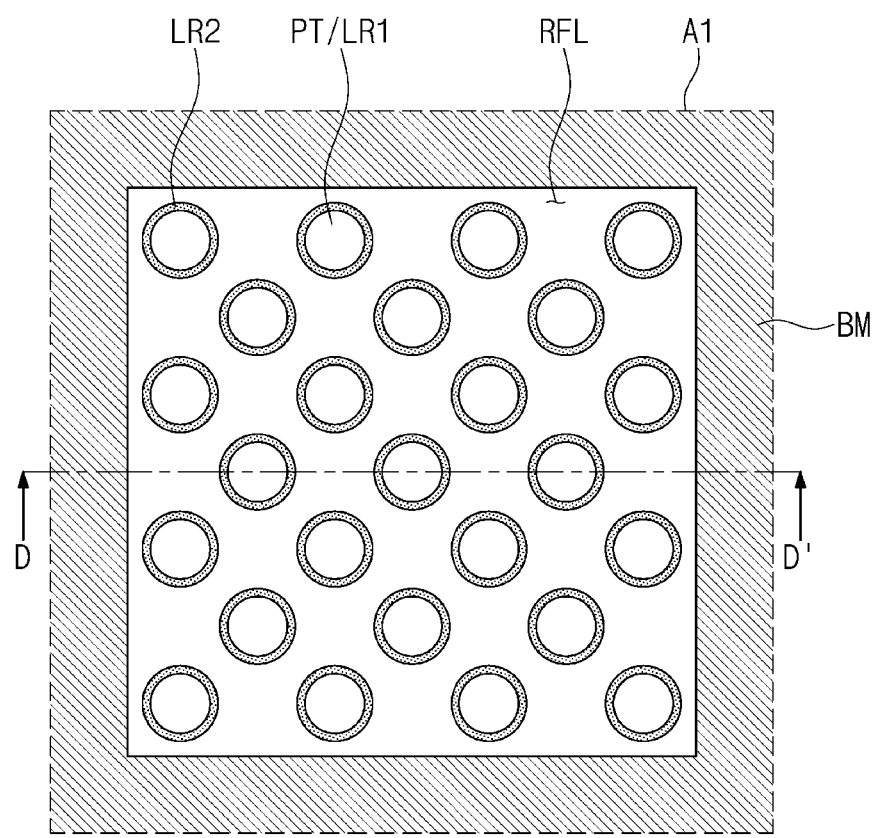
FIG. 7A is an enlarged plan view showing a display panel in an area A1 shown in FIG. 3.

Referring to FIGS. 6A and 6B, patterns PT included in a first layer LR1 of an anti-reflective layer RPL may be formed by removing portions of the first layer LR1. In this case, a second layer LR2 may be disposed between the patterns PT formed by partially removing the portions of the first layer LR1. In an embodiment, the first layer LR1, the patterns PT formed in the first layer LR1, and the second layer LR2 disposed between the patterns PT may be disposed in the second green opening area OA2-G. FIG. 7A is an enlarged plan view showing a display panel in an area A1 shown in FIG. 3, and FIG. 7B is an enlarged schematic cross-sectional view taken along a line D-D' shown in FIG. 7A.

Figure 7B:
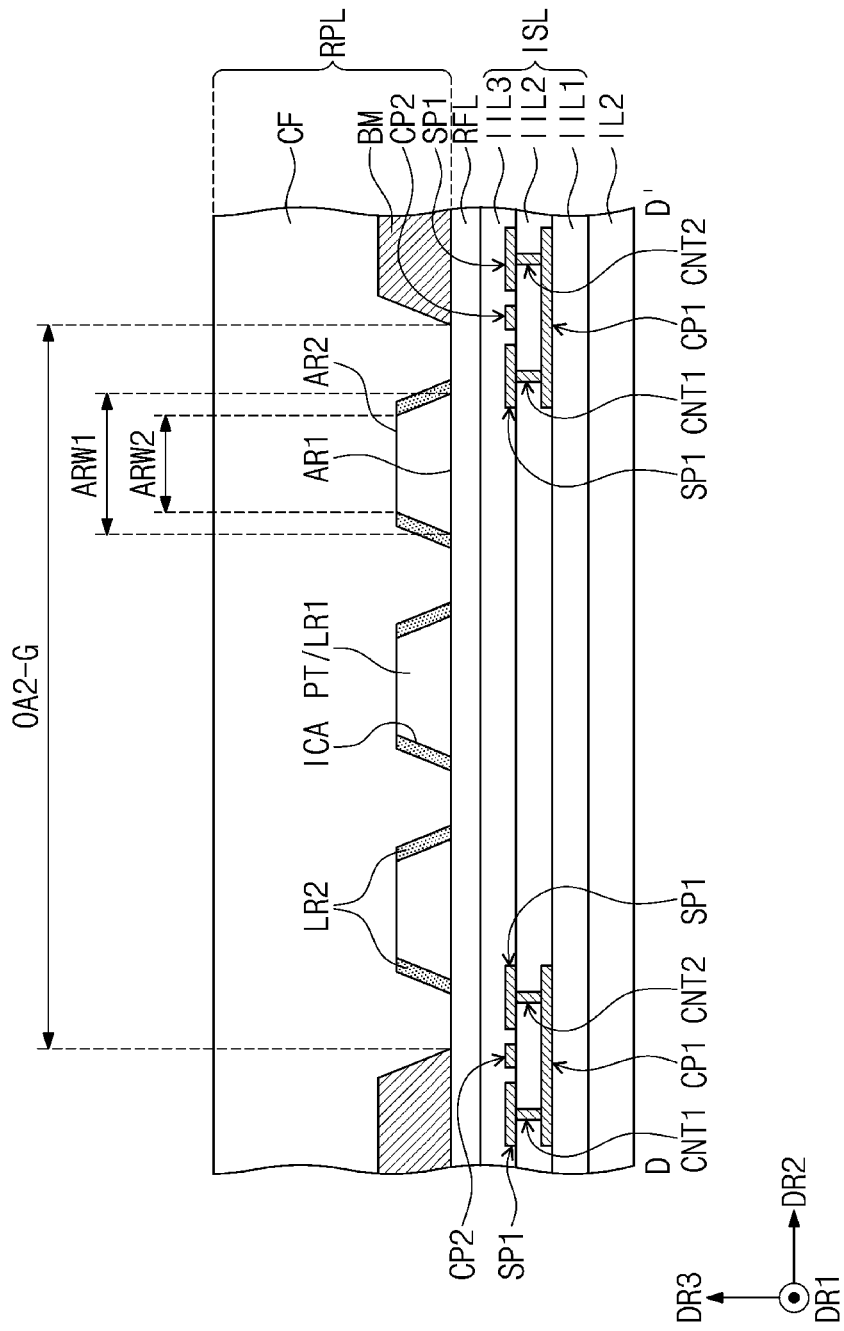
FIG. 7B is an enlarged schematic cross-sectional view taken along a line D-D' shown in FIG. 7A.

Referring to FIGS. 7A and 7B, a second layer LR2 of an anti-reflective layer RPL may be disposed on an inclination surface ICA of patterns PT included in a first layer LR1. In an embodiment, the patterns PT included in the first layer LR1, the second layer LR2 surrounding the patterns PT, and a high refractive-index layer RFL of an input sensing layer ISL on which the anti-reflective layer RPL may be formed or disposed may be disposed in the second green opening area OA2-G. however, they should not be limited thereto or thereby. For example, in a case that the high refractive-index layer RFL is not disposed on the input sensing layer ISL, the third insulating layer IIL3 may be disposed, and in a case that the input sensing layer ISL is not disposed, the encapsulation layer TFE may be disposed.

Figure 8A:
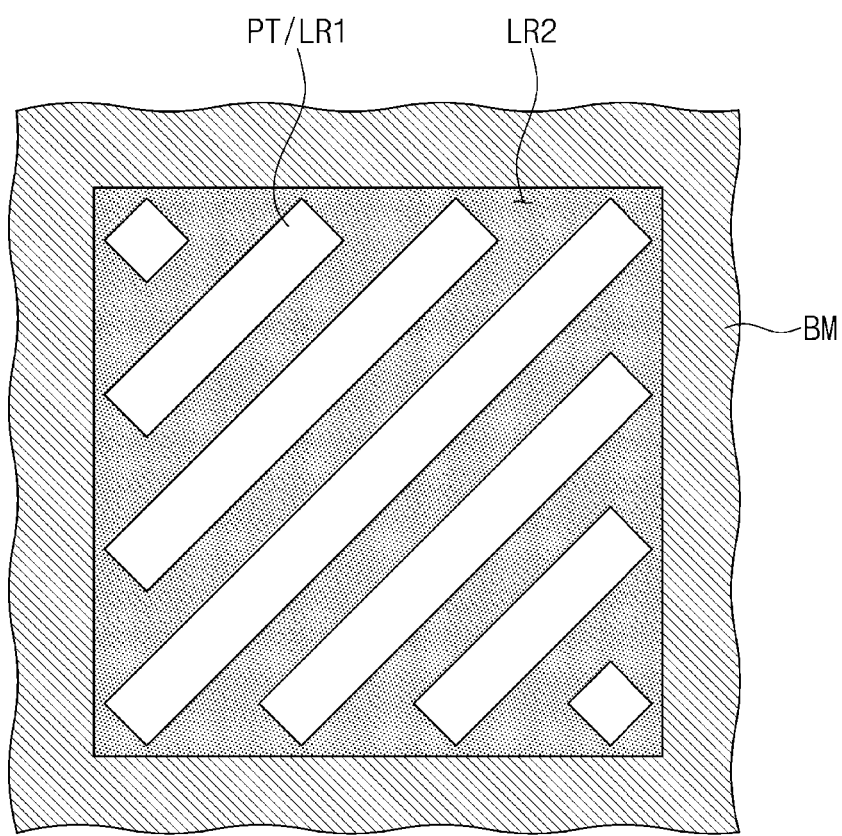
FIGS. 8A and 8B are enlarged plan views showing a display panel in an area A1 shown in FIG. 3.
Figure 8B:
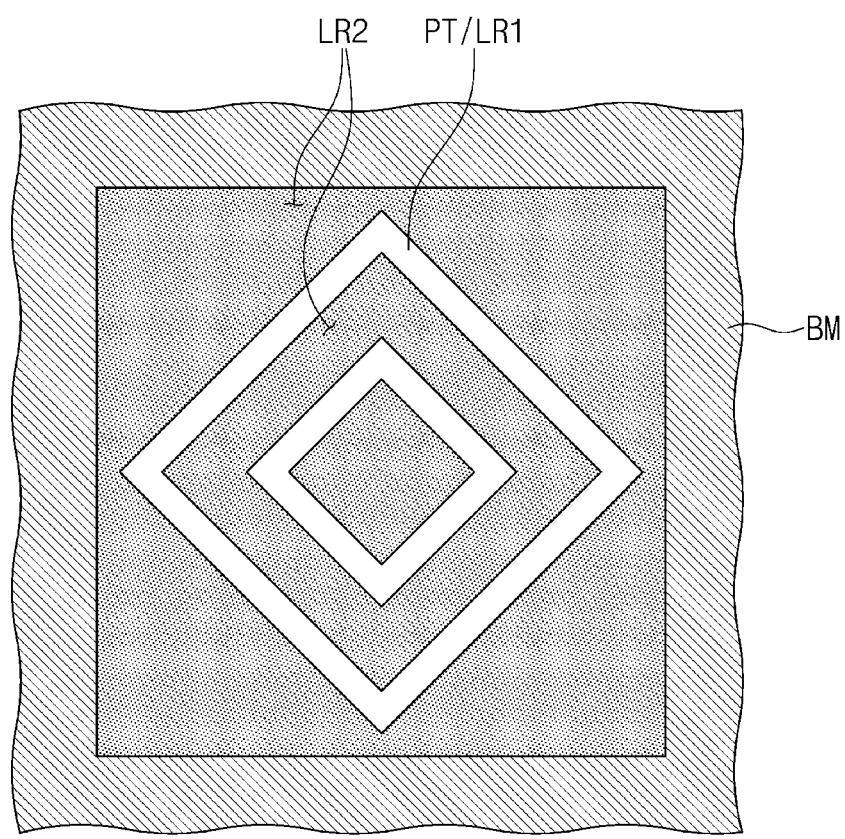

FIGS. 8A and 8B are enlarged plan views showing a display panel in an area A1 shown in FIG. 3. Referring to FIG. 8A, patterns PT included in a first layer LR1 of an anti-reflective layer RPL may extend in the first direction AX1 and may be disposed in the second direction AX2 to be spaced apart from each other, however, they should not be limited thereto or thereby. As another example, the patterns PT included in the first layer LR1 of the anti-reflective layer RPL may extend in the second direction AX2 and may be disposed in the first direction AX1 to be spaced apart from each other.

Referring to FIG. 8B, patterns PT included in a first layer LR1 of an anti-reflective layer RPL may be disposed to have closed-loop shapes with different sizes from each other. The patterns PT may have a substantially quadrangular shape. The patterns PT may be disposed to have different lengths and/or widths from each other. However, they should not be limited thereto or thereby. The patterns PT may be disposed to have circular shapes. The patterns PT may be disposed to have different radii from each other. In a case that the patterns PT extend in the first direction AX1 or the second direction AX2 or have the closed-loop shape, the number of the inclination surfaces ICA formed in the anti-reflective layer RPL may decrease. Accordingly, the light generated by the light emitting elements EMD travels to the third reference direction DR3 (refer to FIG. 1) perpendicular to the display device DD, and thus, the light extraction efficiency of the display panel DP (refer to FIG. 1) may be prevented from being deteriorated due to the anti-reflective layer RPL.

Figure 9:
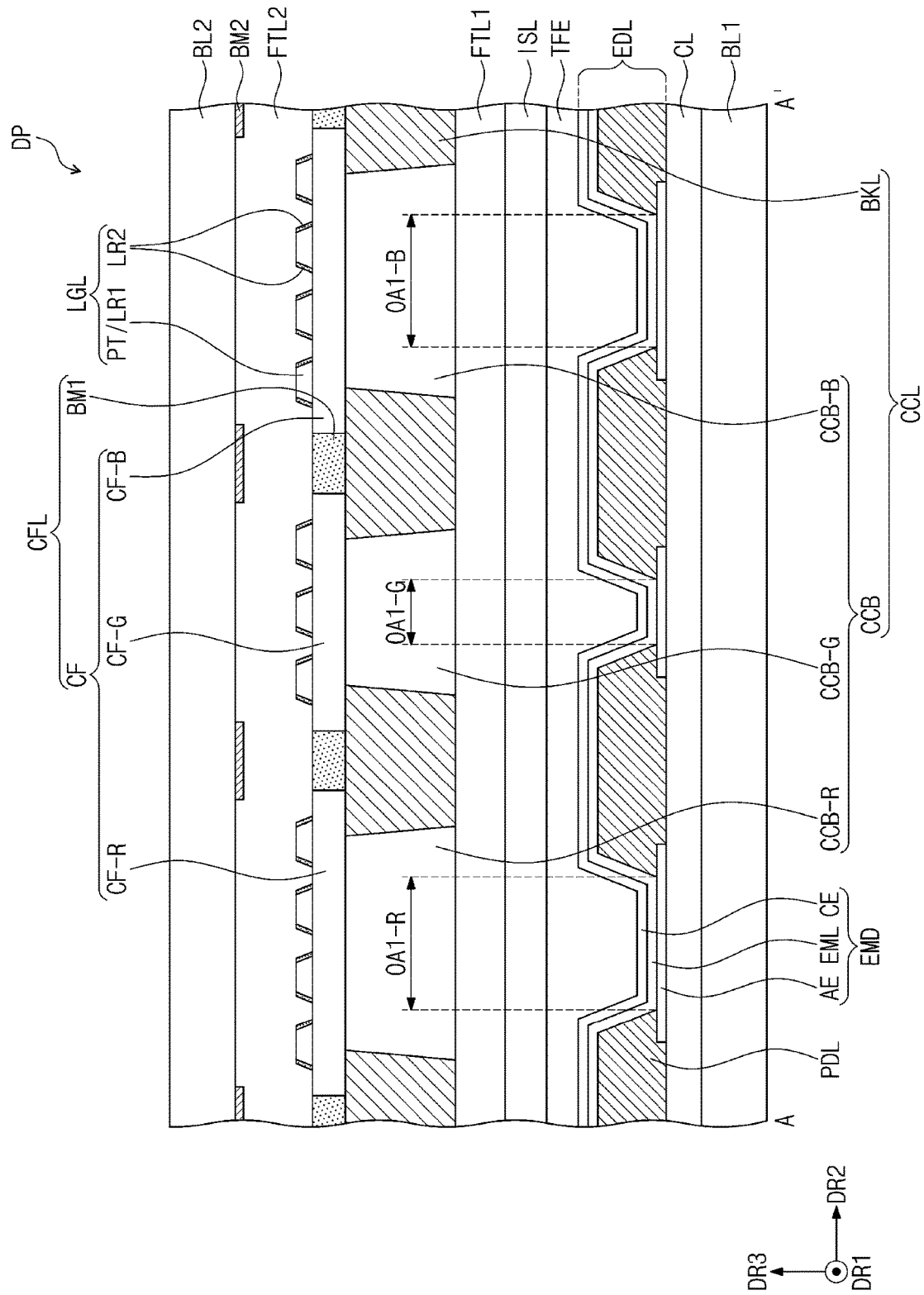
FIG. 9 is a schematic cross-sectional view taken along a line A-A' shown in FIG. 2.

FIG. 9 is a schematic cross-sectional view taken along a line A-A' shown in FIG. 2.

Referring to FIG. 9, the display panel DP may include a first base layer BL1, a circuit layer CL disposed on the first base layer BL1, a light emitting element layer EDL disposed on the circuit layer CL, an encapsulation layer TFE disposed on the light emitting element layer EDL, a color conversion layer CCL disposed on the encapsulation layer TFE, a light guide layer LGL disposed on the color conversion layer CCL, and a second base layer BL2.

The first base layer BL1 may provide a base surface on which the circuit layer CL may be disposed. The first base layer BL1 may be a glass substrate, a metal substrate, and a plastic substrate, however, the disclosure should not be limited thereto or thereby. As another example, the first base layer BL1 may be an inorganic layer, an organic layer, or a composite material layer.

The second base layer BL2 may be disposed on the light guide layer LGL. The second base layer BL2 may provide a base surface on which the light guide layer LGL and the color conversion layer CCL may be disposed. The second base layer BL2 may be a glass substrate, a metal substrate, and a plastic substrate, however, the disclosure should not be limited thereto or thereby. As another example, the second base layer BL2 may be an inorganic layer, an organic layer, or a composite material layer.

The light emitting element layer EDL may include a light emitting element EMD that emits a first color light. The first color light may be a blue light. The light emitting layer EML may be a common layer that may be commonly disposed over a plurality of light emitting elements EMD. For example, the light emitting elements EMD may commonly emit the first color light through the light emitting layer EML. The light emitting layer EML may have a single-layer structure including a single material, a single-layer structure including a plurality of different materials, or a multi-layer structure including a plurality of different materials from each other. The light emitting layer EML should not be particularly limited and may include a fluorescent substance or a phosphorescent substance. For example, the light emitting layer EML may include a host and a dopant.

An input sensing layer ISL and a first planarization layer FTL1 may be disposed between the encapsulation layer TFE and the color conversion layer CCL. The input sensing layer ISL may be disposed directly on the encapsulation layer TFE. The first planarization layer FTL1 may have a single-layer structure of an organic layer or may have a multi-layer structure of an organic layer and an inorganic layer. The first planarization layer FTL1 may provide a planarization surface thereon.

The color conversion layer CCL may include a color conversion member CCB. The color conversion member CCB may include a quantum dot or a fluorescent substance. The color conversion member CCB may convert a wavelength of a light provided thereto and may emit the converted light. For example, the color conversion layer CCL may be a layer including the quantum dot or layer including the fluorescent substance.

The color conversion layer CCL may include a plurality of color conversion members CCB-R, CCB-G, and CCB-B. The color conversion members CCB-R, CCB-G, and CCB-B may be spaced apart from each other in the first and second reference directions, DR1 and DR2.

A barrier layer BKL may be disposed between the color conversion members CCB-R, CCB-G, and CCB-B spaced apart from each other, however, an embodiment should not be limited thereto or thereby. The barrier layer BKL may be a black matrix. The barrier layer BKL may include an organic or inorganic light blocking material that may contain a black pigment or dye. The barrier layer BKL may prevent a light leakage phenomenon and may serve as a boundary between the color conversion members CCB-R, CCB-G, and CCB-B adjacent to each other.

The color conversion members CCB-R, CCB-G, and CCB-B may include a first color conversion member CCB-R that may convert the first color light provided from the light emitting element layer EDL to a second color light, a second color conversion member CCB-G that may convert the first color light provided from the light emitting element layer EDL to a third color light, and a third color conversion member CCB-B that may transmit the first color light. The first color conversion member CCB-R may correspond to a first red opening area OA1-R, the second color conversion member CCB-G may correspond to a first green opening area OA1-G, and the third color conversion member CCB-B may correspond to a first blue opening area OA1-B.

In an embodiment, the first color conversion member CCB-R may provide the second color light as the red light, and the second color conversion member CCB-G may provide the third color light as the green light. The third color conversion member CCB-B may transmit the first color light provided from the light emitting element layer EDL as the blue light.

The blue light generated by the light emitting elements EMD may be scattered while passing through the color conversion layer CCL, and thus, a path of the light may become diversified. Accordingly, the light emitted from the light emitting elements EMD may be refracted by the light guide layer LGL while passing through the light guide layer LGL, and thus, deterioration of the light extraction efficiency, which may occur in a case that the light travels not in the third reference direction DR3 (refer to FIG. 1) but in an inclined direction, may be prevented.

The color conversion members CCB-R, CCB-G, and CCB-B may include a quantum dot material. A core of the quantum dot may be selected from a group II-VI compound, a group III-VI compound, a group compound a group III-V compound, a group IV-VI compound, a group IV element, a group IV compound, or a combination thereof.

The group II-VI compound may be selected from a binary compound selected from the group consisting of CdSe, CdTe, Cds, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The group III-VI compound may include a binary compound of $In_2S_3$ or $In_2Se_3$, a ternary compound of $InGaS_3$ or $InGaSe_3$, or an arbitrary combination thereof.

The group compound may include a ternary compound of AgInS, $AgInS_2$, CuInS, $CuInS_2$, $AgGaS_2$, $CuGaS_2$, $CuGaO_2$, $AgGaO_2$, $AgAlO_2$, and a mixture thereof, or a quaternary compound selected from the group consisting of $AgInGaS_2$ and $CuInGaS_2$.

The group III-V compound may be selected from a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGap, InAlP, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. Meanwhile, the group III-V compound may further include a group II metal such as InZnP that is a group III-II-V.

The group IV-VI compound may be selected from a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The group IV element may be selected from the group consisting of Si, Ge, and a mixture thereof. The group IV compound may be a binary compound selected from the group consisting of SiC, SiGe, and a mixture thereof.

In this case, the binary compound, the ternary compound, or the quaternary compound may exist in particles at a uniform concentration or may exist in the same particle after being divided into plural portions having different concentrations. For example, each quantum dot may have a core-shell structure where one quantum dot surrounds another quantum dot. An interface between the core and the shell may have a concentration gradient in which a concentration of elements existing in the shell is lowered as a distance from a center of the core-shell structure decreases.

In an embodiment, the quantum dot may have the above-mentioned core-shell structure including the core containing nanocrystals and the shell surrounding the core. The shell of the quantum dot may serve as a protective layer to prevent chemical modification of the core and to maintain semiconductor properties and/or as a charging layer to give electrophoretic properties to the quantum dot. The shell may have a single-layer or multi-layer structure. The interface between the core and the shell may have the concentration gradient in which the concentration of elements existing in the shell is lowered as the distance from the center of the core-shell structure decreases. As the shell of the quantum dot, oxides of metals or nonmetals, semiconductor compounds, or combinations thereof may be used.

For example, the oxides of the metals or nonmetals may be binary compounds, such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, and $Co_3O_4$, $NiO$, or ternary compounds, such as $MgAl_2O_4$, $CoFe_2O_4$, $NiFe_2O_4$, and $CoMn_2O_4$, however, the disclosure should not be limited thereto or thereby.

The semiconductor compounds may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb, however, the disclosure should not be limited thereto or thereby.

The quantum dot may have a full width at half maximum (FWHM) of the light emitting wavelength spectrum, which may be about 45 nm or less, about 40 nm or less, or about 30 nm or less, and a color purity or a color reproducibility may be improved in the above-mentioned range. For example, since the light emitted through the quantum dot may travel in all directions, an optical viewing angle may be improved.

For example, the quantum dot should not be limited to a specific shape. In detail, the quantum dot may have a variety of shapes, for example, a substantially globular shape, a substantially pyramid shape, a substantially multi-arm shape, a substantially cubic nano-particle, a nano-tube, a nano-wire, a nano-fabric, and a substantially nanoplate-shaped particle.

The color of the light emitted from the quantum dot may be changed in accordance with the particle size. Therefore, the quantum dot may have a variety of light emitting colors, such as the blue, red, or green color.

A color filter layer CFL may be further disposed between the color conversion layer CCL and the light guide layer LGL. The color filter layer CFL may include a first color filter CF-R provided to correspond to the first color conversion member CCB-R, a second color filter CF-G provided to correspond to the second color conversion member CCB-G, and a third color filter CF-B provided to correspond to the third color conversion member CCB-B. The first color filter CF-R may be a red color filter, the second color filter CF-G may be a green color filter, and the third color filter CF-B may be a green blue filter. The first, second, and third color filters CF-R, CF-G, and CF-B may be spaced apart from each other in the first and second reference directions DR1 and DR2 (refer to FIG. 3).

A first light blocking layer BM1 may be disposed between the first, second, and third color filters CF-R, CF-G, and CF-B spaced apart from each other, however, an embodiment should not be limited thereto or thereby.

The light guide layer LGL may be disposed on the color filter layer CFL. The light guide layer LGL may include a first layer LR1 including patterns PT and a second layer LR2.

A second planarization layer FTL2 may be disposed on the light guide layer LGL. The second planarization layer FTL2 may have a single-layer structure of an organic layer or may have a multi-layer structure of an organic layer and an inorganic layer. The second planarization layer FTL2 may provide a planarization layer thereon.

A second light blocking layer BM2 may be disposed between the second planarization layer FTL2 and the second base layer BL2. The second light blocking layer BM2 may prevent the light leakage phenomenon from occurring and may provide boundaries between the lights converted by the color conversion layer.

Figure 10:
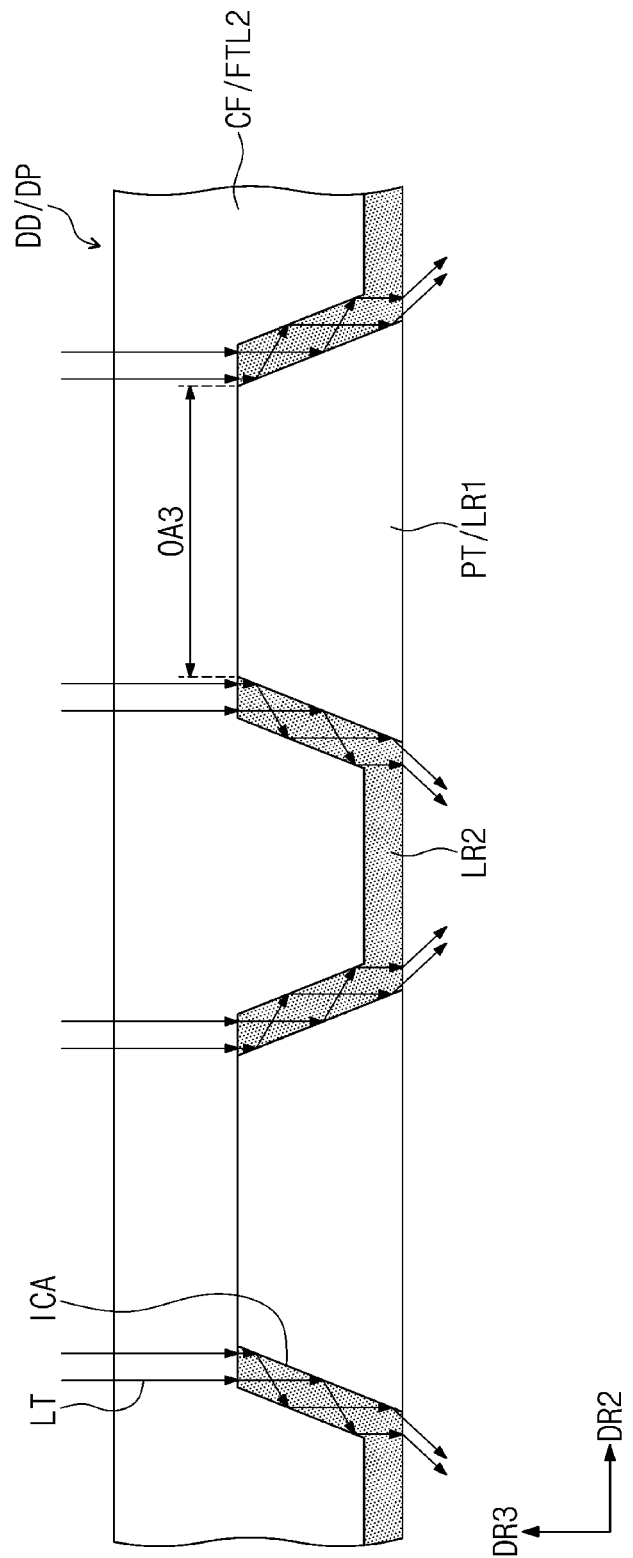
FIG. 10 is a schematic cross-sectional view showing a path of an external light incident into a display device and passing through a display panel.

FIG. 10 is a schematic cross-sectional view showing a path of the light incident into the display device from the outside and passing through a display panel.

Referring to FIGS. 3 and 10, the second layer LR2 having the second refractive index n2 may be disposed between the patterns PT included in the first layer LR1 and having the first refractive index n1 and the color filter CF or the second planarization layer FTL2 disposed on the first layer LR1. In this case, the color filter CF or the second planarization layer FTL2 may have a refractive index lower or less than the second refractive index n2. In a case that a light LT is incident into the second layer LR2 having the second refractive index n2 of the display device DD, the incident light may be totally reflected by Snell's law since the second layer LR2 has the second refractive index n2 higher than that of the surroundings, and thus, the incident light is incident along an inclined direction with respect to the third reference direction DR3 without being incident along a direction opposite to the third reference direction DR3 perpendicular to the display panel DP of the display device DD. Accordingly, the light LT travels to the pixel definition layer PDL or the barrier layer BKL of the color conversion layer CCL rather than the first electrodes AE of the light emitting element EMD, and consequently, an amount of the light LT reflected by the first electrodes AE of the light emitting element EMD may be reduced. As a result, a contrast and a visibility of the display device DD may be prevented from being deteriorated.

Although embodiments have been described, it is understood that the disclosure should not be limited to these embodiments but various changes and modifications can be made by one of ordinary skill in the art within the spirit and scope of the disclosure as hereinafter claimed. Therefore, the disclosed subject matter should not be limited to any single embodiment described herein, and the scope of the disclosure shall be determined according to the attached claims and equivalents thereof.

What is claimed is:
1. A display device comprising:
a display panel comprising light emitting elements and an encapsulation layer disposed on the light emitting elements;
an anti-reflective layer disposed on the display panel; and an input sensing layer disposed between the display panel and the anti-reflective layer,
wherein the anti-reflective layer comprises:
a first layer spaced apart from the light emitting elements and comprising a pattern having a first refractive index;
a second layer having a second refractive index greater than the first refractive index of the first layer; and
a color filter layer overlapping the first layer and the second layer and comprising a plurality of color filters and a plurality of light blocking layers disposed between the plurality of color filters, the plurality of light blocking layers being disposed on a same plane as the first and second layers with respect to a cross-sectional view of the display device,
wherein
the pattern of the first layer comprises a surface inclined with respect to an upper surface of the display panel,
the second layer is disposed on the surface of the pattern of the first layer,
the first layer, the second layer, and the color filter layer are sequentially stacked on each other with the second layer disposed between the first layer and the color filter layer in a thickness direction of the display device,
the second layer having a higher index of refraction than an index of refraction of the color filter layer, and
the second layer is configured to transmit incident external light away from the light emitting elements.

2. The display device of claim 1, wherein the display panel further comprises a pixel definition layer disposed between the light emitting elements.

3. The display device of claim 2, wherein the pixel definition layer comprises a light blocking material.

4. The display device of claim 3, wherein
the pixel definition layer includes a first opening area that exposes the light emitting elements, and
each of the plurality of light blocking layers include a second opening area, the second opening area being larger than the first opening area.

5. The display device of claim 4, wherein the first layer and the second layer of the anti-reflective layer are disposed in the second opening area.

6. The display device of claim 3, wherein
each of the light emitting elements include an anode electrode, a light emitting layer and a cathode electrode sequentially stacked on each other,
the anode electrode is a reflective electrode, and
a portion of the second layer corresponding to the inclined surface is configured to guide the incident external light away from the light emitting elements and towards the pixel definition layer.

7. The display device of claim 1, wherein
the encapsulation layer overlaps the light emitting elements, and
the input sensing layer is disposed directly on the encapsulation layer.

8. The display device of claim 1, wherein
the pattern of the first layer of the anti-reflective layer comprises:
a first surface facing the upper surface of the display panel; and
a second surface opposite to the first surface, and
the second surface has a smaller width than a width of the first surface.

9. The display device of claim 8, wherein the second layer of the anti-reflective layer includes a third opening area that exposes the second surface of the pattern of the first layer of the anti-reflective layer.

10. The display device of claim 1, wherein
the pattern is provided in plural, and
the plurality of patterns are spaced apart from each other in a first direction and a second direction, the first and second directions being different from each other.

11. The display device of claim 1, wherein
the pattern is provided in plural, and
the plurality of patterns are extended in a first direction and spaced apart from each other in a second direction, the first and second directions being different from each other.

12. The display device of claim 1, wherein the pattern has a closed-loop shape.

13. The display device of claim 1, wherein the anti-reflective layer is configured to guide the incident external light through a portion of the second layer corresponding to the inclined surface away from the light emitting elements by transmission through the second layer and reflection off an interface between the second layer and the first layer and off an interface between the second layer and the color filter layer.

14. The display device of claim 1, wherein the anti-reflective layer is a waveguide that guides the incident external light away from the light emitting elements by transmission through the second layer.

15. The display device of claim 1, wherein each of the first layer and the second layer are optically transparent and are comprised of a material selected from silicon nitride, silicon oxynitride, silicon oxide, titanium oxide, and aluminum oxide.

16. A display panel comprising:
a light emitting element layer emitting a first color light;
a color conversion layer comprising a plurality of color conversion members disposed on the light emitting element layer, receiving the first color light from the light emitting element layer, and converting the first color light to emit at least two different color lights; and
a light guide layer disposed on the color conversion layer and changing a path of a light incident into the display panel from an outside of the display panel;
an input sensing layer disposed between the light emitting element layer and the light guide layer,
a color filter layer disposed between the color conversion layer and the light guide layer, and
a planarization layer disposed on the light guide layer,
wherein the light guide layer comprising:
a first layer spaced apart from the light emitting layer and comprising a surface inclined with respect to an upper surface of the color conversion layer, and a pattern having a first refractive index; and
a second layer disposed on the surface of the first layer and having a second refractive index greater than each of the first refractive index and a refractive index of the planarization layer, wherein
no other layers are disposed between the color filter layer and the first and second layers with respect to a cross-sectional view of the display panel,
the second layer is disposed between the first layer and the planarization layer in a thickness direction of the display panel, and
the light guide layer is configured to prevent incident external light from reaching a pixel electrode of the light emitting element by guiding the incident external light through a portion of the second layer corresponding to the inclined surface.

17. The display panel of claim 16, wherein the light emitting element layer comprises:
light emitting elements emitting the first color light; and
a pixel definition layer disposed between the light emitting elements.

18. The display panel of claim 16, wherein the color filter layer comprises:
a plurality of color filters; and
a light blocking layer disposed between the plurality of color filters.

19. The display panel of claim 16, wherein the color conversion layer further comprises a barrier layer disposed between the plurality of color conversion members, and
the barrier layer comprises a light blocking material.

20. The display panel of claim 19, wherein the light guide layer overlaps the plurality of color conversion members and the barrier layer.

* * * * *